(12) United States Patent
Yamada et al.

(10) Patent No.: US 11,121,001 B2
(45) Date of Patent: Sep. 14, 2021

(54) METHOD OF ETCHING, DEVICE MANUFACTURING METHOD, AND PLASMA PROCESSING APPARATUS

(71) Applicant: Tokyo Electron Limited, Tokyo (JP)

(72) Inventors: Satoshi Yamada, Miyagi (JP); Koki Chino, Miyagi (JP); Yoshimitsu Kon, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/991,938

(22) Filed: Aug. 12, 2020

(65) Prior Publication Data

US 2021/0057228 A1 Feb. 25, 2021

(30) Foreign Application Priority Data

Aug. 22, 2019 (JP) .............................. JP2019-151867

(51) Int. Cl.
    *H01L 21/311* (2006.01)
    *H01L 21/67* (2006.01)
    *H01L 21/308* (2006.01)
    *H01L 21/3065* (2006.01)

(52) U.S. Cl.
    CPC ...... *H01L 21/31116* (2013.01); *H01L 21/308* (2013.01); *H01L 21/3065* (2013.01); *H01L 21/31144* (2013.01); *H01L 21/67069* (2013.01)

(58) Field of Classification Search
    None
    See application file for complete search history.

(56) References Cited

U.S. PATENT DOCUMENTS

2015/0017809 A1* 1/2015 Bhowmick ....... H01L 21/31144
                                                            438/712

FOREIGN PATENT DOCUMENTS

WO         03/030239 A1    4/2003

* cited by examiner

*Primary Examiner* — Roberts P Culbert
(74) *Attorney, Agent, or Firm* — Studebaker & Brackett PC

(57) ABSTRACT

In a disclosed method, etching a film by using plasma of a first processing gas and etching the film by using plasma of a second processing gas are alternately repeated. The first processing gas and the second processing gas each include a fluorocarbon gas. In etching the film by using the plasma of the first processing gas and etching the film by using the plasma of the second processing gas, radio frequency power is used to attract ions to the substrate. The first processing gas further includes an additive gas that is a source for nitrogen or sulfur and fluorine. In the first processing gas, the flow rate of the additive gas is smaller than the flow rate of the fluorocarbon gas.

10 Claims, 6 Drawing Sheets

METHOD OF ETCHING, DEVICE MANUFACTURING METHOD, AND PLASMA PROCESSING APPARATUS

CROSS-REFERENCE TO RELATED APPLICATIONS

This application is based on and claims the benefit of priority from Japanese Patent Application No. 2019-151867 filed on Aug. 22, 2019, the entire contents of which are incorporated herein by reference.

FIELD

Exemplary embodiments of the present disclosure relate to a method of etching, a device manufacturing method, and a plasma processing apparatus.

BACKGROUND

Plasma etching is used to transfer a pattern of a mask to a film. In the plasma etching, it is required to etch the film while protecting a sidewall surface that defines an opening. Therefore, plasma etching is performed using a mixed gas of a protective film formation gas and an etching gas. Such plasma etching is described in international Publication No. WO 2003/030239.

SUMMARY

In an exemplary embodiment, a method of etching a film of a substrate is provided. The substrate has a film and a mask. The film of the substrate is a film capable of being etched by fluorine chemical species. The mask is provided on the film. The mask provides, in a first region in the substrate, an opening having a width larger than the width of an opening which is provided in a second region in the substrate. The method includes (a) etching the film by using plasma of a first processing gas that includes a fluorocarbon gas. The method further includes (b) etching the film by using plasma of a second processing gas that includes a fluorocarbon gas. The (a) and the (b) are alternately repeated. In both of the (a) and the (b), radio frequency power is supplied to a lower electrode of a substrate support that supports the substrate to attract ions to the substrate to etch the film. The first processing gas further includes an additive gas that is a source for nitrogen or sulfur and fluorine. A flow rate of the additive gas in the first processing gas is smaller than a flow rate of the fluorocarbon gas in the first processing gas.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
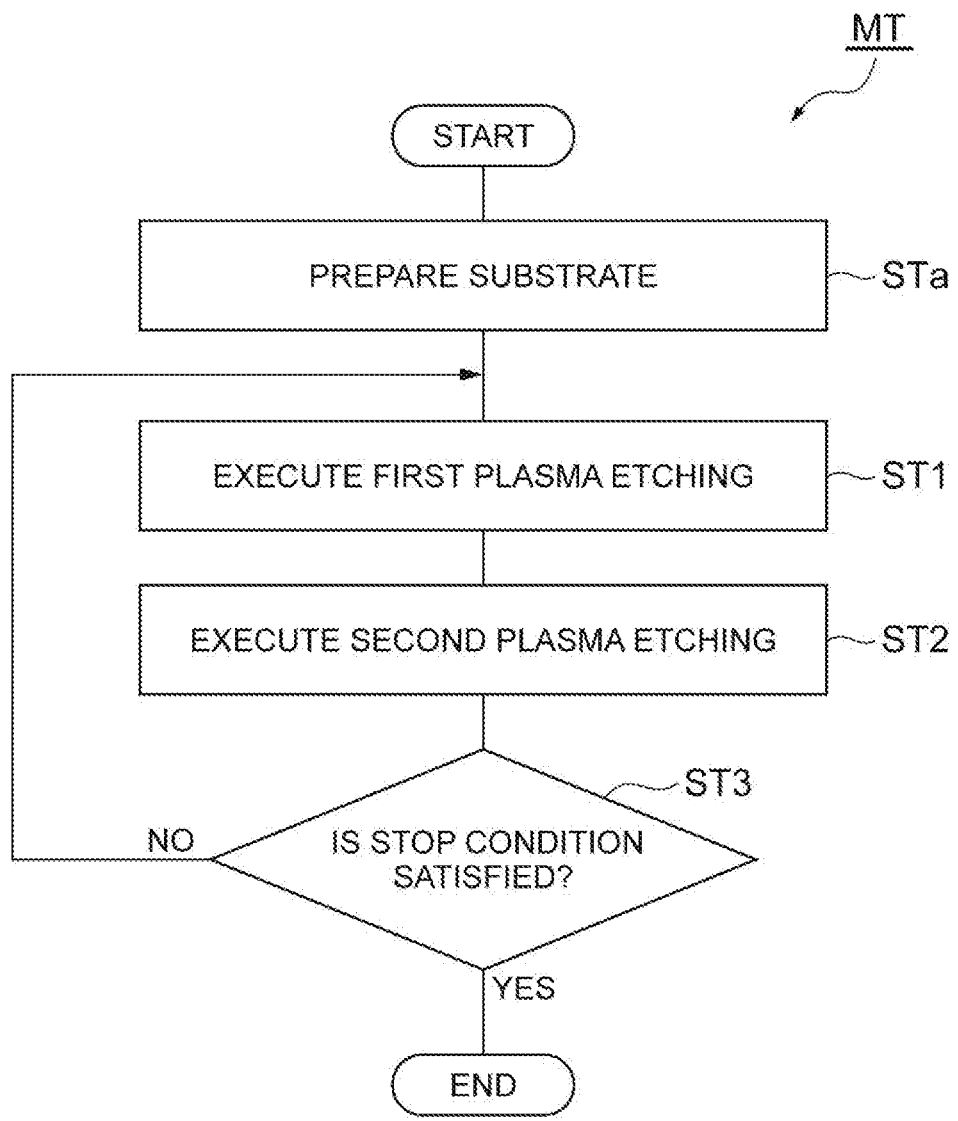
FIG. 1 is a flowchart of a method of etching a film of a substrate according to an exemplary embodiment.

Hereinafter, various exemplary embodiments will be described.

In an exemplary embodiment, a method of etching a film of a substrate is provided. The substrate has a film and a mask. The film of the substrate is a film capable of being etched by fluorine chemical species. The mask is provided on the film. The mask provides, in a first region in the substrate, an opening having a width larger than the width of an opening which is provided in a second region in the substrate. The method includes (a) etching the film by using plasma of a first processing gas that includes a fluorocarbon gas. That is, the method includes executing a first plasma etching on the film. The method further includes (b) etching the film by using plasma of a second processing gas that includes a fluorocarbon gas. That is, the method further includes executing a second plasma etching on the film. The operation (a) and the operation (b) are alternately repeated. In both of the operation (a) and the operation (b), radio frequency power is supplied to a lower electrode of a substrate support that supports the substrate to attract ions to the substrate to etch the film. The first processing gas further includes an additive gas that is a source for nitrogen or sulfur and fluorine. A flow rate of the additive gas in the first processing gas is smaller than a flow rate of the fluorocarbon gas in the first processing gas.

In a case where radio frequency power for bias is supplied to the lower electrode; the fluorine chemical species from the plasma of the fluorocarbon gas etches the film. However, in the region where a wide opening is formed, the carbon-containing substance from the plasma of the fluorocarbon gas is deposited to cover the surface of the substrate, and therefore, the etching of the film may be stopped. In the method according to the embodiment described above, since the additive gas is added to the first processing gas, a decrease in the etching rate of the film is prevented, and the stop of the etching of the film in the first region is prevented. Further, since the additive gas is added to the first processing gas out of the first processing gas and the second processing gas and the flow rate of the additive gas is smaller than the flow rate of the fluorocarbon gas in the first processing gas, the etching of the mask by the plasma of the additive gas can be prevented. Therefore, the selectivity of the etching of the film with respect to the mask is enhanced.

In an exemplary embodiment, the additive gas may be an $NF_3$ gas, an $SF_6$, gas, or a mixed gas containing a nitrogen gas and a fluorine gas.

In an exemplary embodiment, in each of the fluorocarbon gas included in the first processing gas and the fluorocarbon gas included in the second processing gas, the ratio of (the number of carbon atoms)/(the number of fluorine atoms) may be ½ or more and ⅝ or less.

In an exemplary embodiment, each of the fluorocarbon gas that is included in the first processing gas and the fluorocarbon gas that is included in the second processing gas may be a $C_4F_6$ gas, a $C_4F_8$ gas, or a $C_5F_8$ gas.

In an exemplary embodiment, a time length of the operation (a) may be longer than a time length of the operation (b).

In an exemplary embodiment, the operation (a) may be performed before the operation (b).

In an exemplary embodiment, the film may be a silicon-containing film. The silicon-containing film may be a silicon film or a silicon oxide film.

In an exemplary embodiment, the flow rate of the fluorocarbon gas in the second processing gas may be larger than the flow rate of the fluorocarbon gas in the first processing gas.

In another exemplary embodiment, a device manufacturing method is provided. The device manufacturing method includes etching a film of a substrate by the method according to any one of the embodiments described above.

In still another exemplary embodiment, a plasma processing apparatus that is used to etch a film of a substrate is provided. The plasma processing apparatus includes a chamber, a substrate support, a radio frequency power source, a gas supply unit, and a controller. The substrate support is provided in the chamber. The substrate support includes a lower electrode. The substrate support is configured to support the substrate placed thereon. The radio frequency power source is electrically connected to the lower electrode. The gas supply unit is configured to supply a first processing gas that includes a fluorocarbon gas and a second processing gas that includes a fluorocarbon gas into the chamber. The controller is configured to control the radio frequency power source and the gas supply unit. The controller is configured to alternately repeat first control and second control. In the first control, the controller controls the gas supply unit to supply the first processing gas into the chamber to etch the film by using plasma of the first processing gas. In the second control, the controller controls the gas supply unit to supply the second processing gas into the chamber to etch the film by using plasma of the second processing gas. The controller controls the radio frequency power source to supply radio frequency power to the lower electrode in both of the first control and the second control to attract ions to the substrate to etch the film by using the plasma of the first processing gas and to etch the film by using the plasma of the second processing gas. The controller controls, in the first control, the gas supply unit to cause an additive gas that is a source for nitrogen or sulfur and fluorine to be included in the first processing gas and to set a flow rate of the additive gas to a flow rate smaller than a flow rate of the fluorocarbon gas in the first processing gas.

Hereinafter, various exemplary embodiments will be described in detail with reference to the drawings. In the drawing, the same or equivalent portions are denoted by the same reference symbols.

FIG. 1 is a flowchart of a method of etching a film of a substrate according to an exemplary embodiment. A method MT shown in FIG. 1 includes step ST1 and step ST2. The method MT is executed to form openings with different widths in the film of the substrate.

Figure 2:
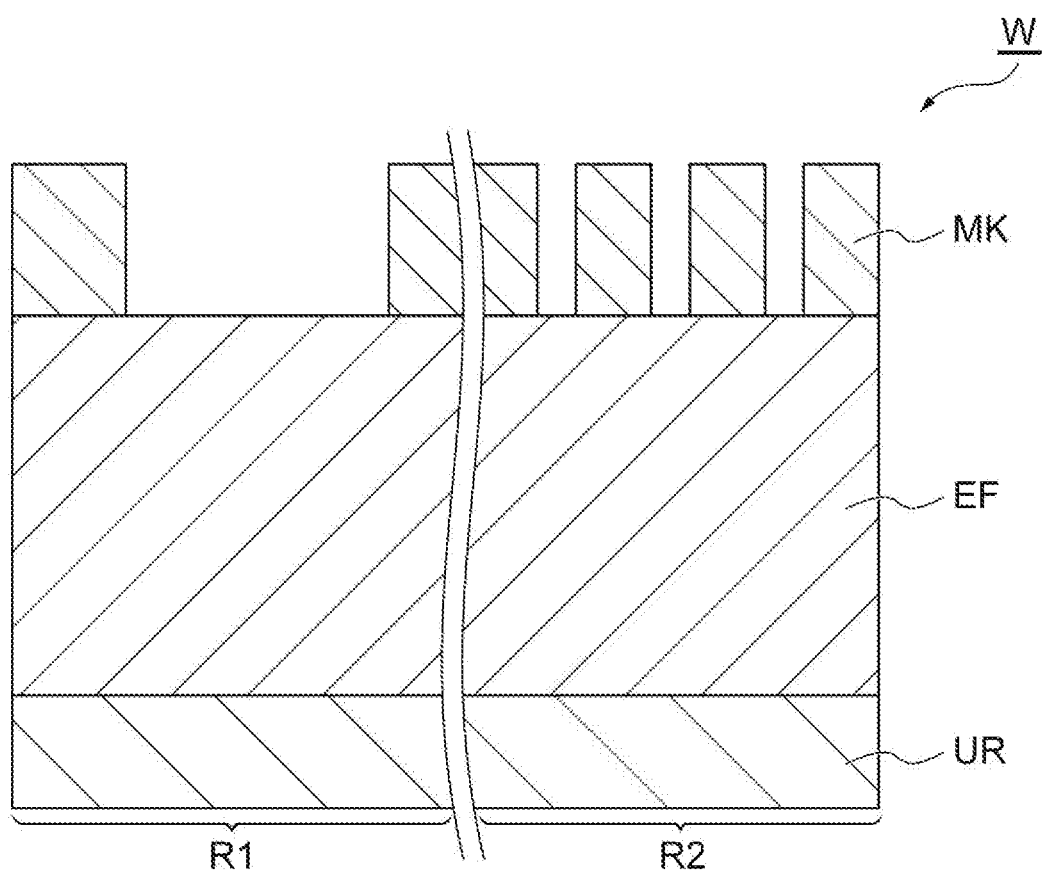
FIG. 2 is a partially enlarged sectional view of a substrate of an example, to which the method shown in FIG. 1 can be applied.

FIG. 2 is a partially enlarged sectional view of a substrate of an example, to which the method shown in FIG. 1 can be applied. A substrate W shown in FIG. 2 has a film EF and a mask MK. The film EF is a film that can be etched by fluorine chemical species. The film EF is, for example, a silicon-containing film. As the silicon-containing film, a silicon film or a silicon oxide film is exemplified. In an embodiment, the substrate W may further include an underlying region UR. The film EF may be provided on the underlying region UR.

The mask MK is provided on the film EF. The etching rate of the mask MK by the fluorine chemical species in steps ST1 and ST2 is lower than the etching rate of the film EF by the fluorine chemical species. That is, the mask MK may be formed of any material as long as the film EF is selectively etched with respect to the mask MK. In a case where the film EF is a silicon oxide film, the mask MK may be formed of an organic material. In a case where the film EF is a silicon film, the mask MK may be formed of silicon oxide.

The mask MK has been patterned. That is, the mask MK has a pattern to be transferred to the film EF. The substrate W has a first region R1 and a second region R2. The mask MK provides, in the first region R1, an opening having a width larger than that of an opening which is provided in the second region R2. The openings which are provided by the mask MK are trenches or holes. In a case where the opening which is provided by the mask MK is a circular hole, the width of the opening is the diameter of the opening.

Figure 3:
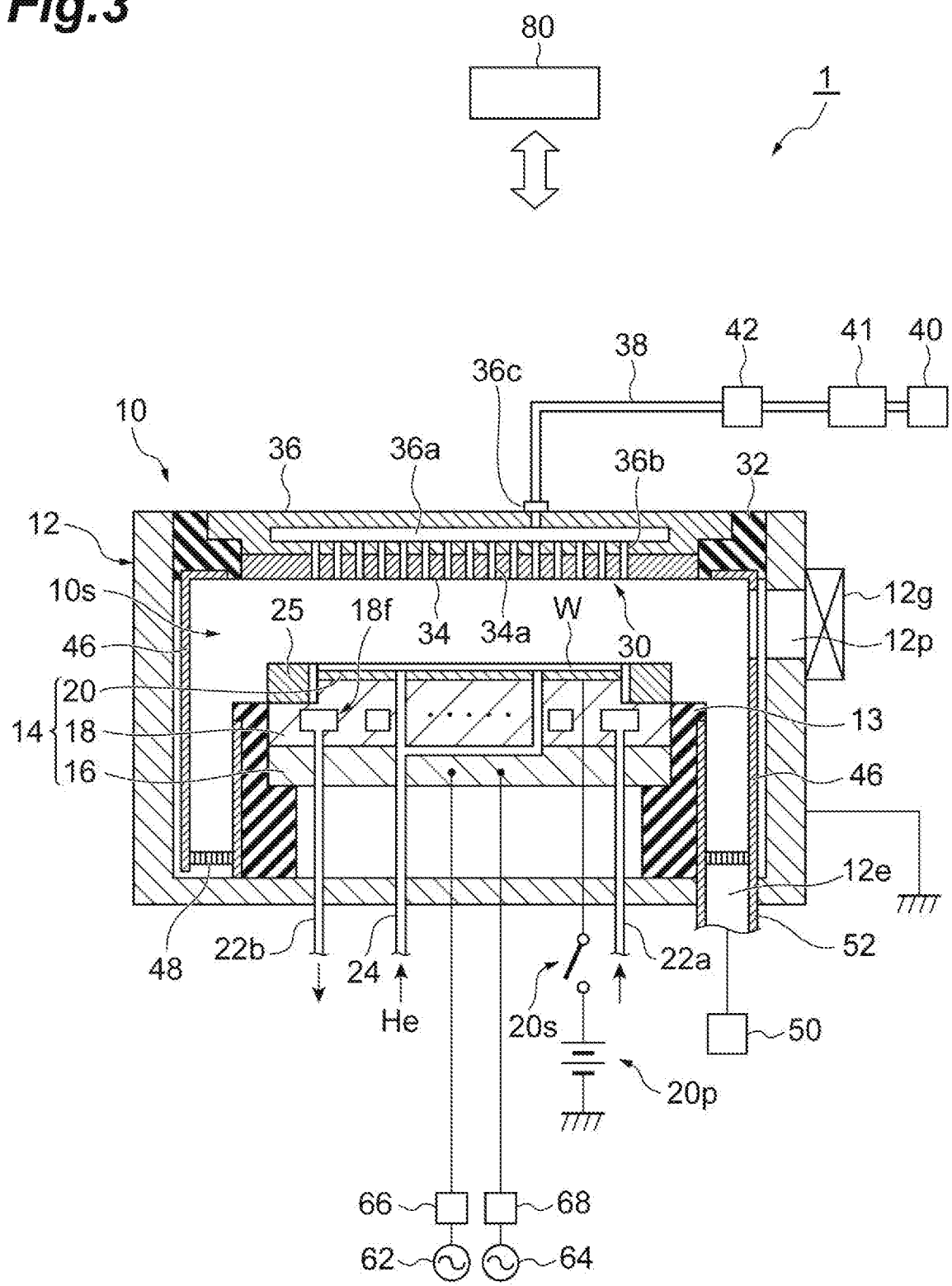
FIG. 3 is a diagram schematically showing a plasma processing apparatus according to an exemplary embodiment.

In the method MT, a plasma processing apparatus is used to execute steps ST1 and ST2. FIG. 3 is a diagram schematically showing a plasma processing apparatus according to an exemplary embodiment.

A plasma processing apparatus 1 includes a chamber 10. The chamber 10 provides an internal space 10s therein. The chamber 10 includes a chamber body 12. The chamber body 12 has a substantially cylindrical shape. The chamber body 12 is formed of, for example, aluminum. A film having corrosion resistance is provided on the inner wall surface of the chamber body 12, The film may be thrilled of ceramic such as aluminum oxide or yttrium oxide.

A passage 12p is formed in the side wall of the chamber body 12. The substrate W is transferred between the internal space 10s and the outside of the chamber 10 through the passage 12p. The passage 12p is opened and closed by a gate valve 12g, The gate valve 12g is provided along the side wall of the chamber body 12.

A support 13 is provided on a bottom portion of the chamber body 12. The support 13 is formed of an insulating material. The support 13 has a substantially cylindrical shape. The support 13 extends upward from the bottom portion of the chamber body 12 in the internal space 10s. The support 13 has a substrate support 14 at an upper portion thereof. The substrate support 14 is configured to support the substrate W in the internal space 10s.

The substrate support 14 has a lower electrode 18 and an electrostatic chuck 20. The substrate support 14 may further include an electrode plate 16. The electrode plate 16 is formed of a conductor such as aluminum and has a substantially disk shape. The lower electrode 18 is provided on the electrode plate 16. The lower electrode 18 is formed of a conductor such as aluminum and has a substantially disk shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 has a main body and an electrode. The main body of the electrostatic chuck 20 has a substantially disk shape and is formed of a dielectric material. The electrode of the electrostatic chuck 20 is a film-shaped electrode and is provided in the main body of the electrostatic chuck 20. The electrode of the electrostatic chuck 20 is connected to a direct-current power source 20p through a switch 20s. If the voltage from the direct-current power source 20p is applied to the electrode of the electrostatic chuck 20, an electrostatic attraction force is generated between the electrostatic chuck 20 and the substrate W. Due to the electrostatic attraction force, the substrate W is held by the electrostatic chuck 20.

An edge ring 25 is disposed on a peripheral edge portion of the lower electrode 18 to surround the edge of the substrate W The edge ring 25 improves in-plane uniformity of plasma processing on the substrate W. The edge ring 25 may be formed of silicon, silicon carbide, quartz, or the like.

A flow path 18f is provided in the interior of the lower electrode 18. A heat exchange medium (for example, a refrigerant) is supplied from a chiller unit (not shown) provided outside the chamber 10 to the flow path 18f through a pipe 22a. The heat exchange medium supplied to the flow path 18f is returned to the chiller unit through a pipe 22b. In the plasma processing apparatus 1, the temperature of the substrate W placed on the electrostatic chuck 20 is adjusted by heat exchange between the heat exchange medium and the lower electrode 18.

The plasma processing apparatus 1 is provided with a gas supply line 24. The gas supply line 24 supplies a heat transfer gas (for example, a He gas) from a heat transfer gas supply mechanism to the gap between the upper surface of the electrostatic chuck 20 and the back surface of the substrate W.

The plasma processing apparatus 1 further includes an upper electrode 30. The upper electrode 30 is provided above the substrate support 14. The upper electrode 30 is supported on an upper portion of the chamber body 12 through a member 32. The member 32 is formed of a material having insulation properties. The upper electrode 30 and the member 32 close an upper opening of the chamber body 12.

The upper electrode 30 may include a ceiling plate 34 and a support 36. The lower surface of the ceiling plate 34 is a lower surface on the internal space 10s side and defines the internal space 10s. The ceiling plate 34 may be formed of a low-resistance conductor or semiconductor in which generation of Joule heat is small. The ceiling plate 34 has a plurality of gas discharge holes 34a that penetrate the ceiling plate 34 in the plate thickness direction thereof.

The support 36 detachably supports the ceiling plate 34. The support 36 is formed of a conductive material such as aluminum. A gas diffusion chamber 36a is provided in the interior of the support 36. The support 36 has a plurality of gas holes 36b extending downward from the gas diffusion chamber 36a. The plurality of gas holes 36b communicate with the plurality of gas discharge holes 34a, respectively. A gas introduction port 36c is formed in the support 36. The gas introduction port 36c is connected to the gas diffusion chamber 36a, A gas supply pipe 38 is connected to the gas introduction port 36c.

A gas source group 40 is connected to the gas supply pipe 38 through a flow rate controller group 41 and a valve group 42. The gas source group 40, the flow rate controller group 41., and the valve group 42 configures a gas supply unit. The gas source group 40 includes a plurality of gas sources. The flow rate controller group 41 includes a plurality of flow rate controllers. Each of the plurality of flow rate controllers of the flow rate controller group 41 is a mass flow controller or a pressure control type flow rate controller. The valve group 42 includes a plurality of on-off valves. Each of the plurality of gas sources of the gas source group 40 is connected to the gas supply pipe 38 through a corresponding flow rate controller of the flow rate controller group 41 and a corresponding on-off valve of the valve group 42.

In the plasma processing apparatus 1, a shield 46 is detachably provided along the inner wall surface of the chamber body 12 and the outer periphery of the support 13. The shield 46 prevents reaction by-products from adhering to the chamber body 12. The shield 46 is configured by forming a film having corrosion resistance on the surface of a base material formed of aluminum, for example. The film having corrosion resistance may be formed of ceramic such as yttrium oxide.

A baffle plate 48 is provided between the support 13 and the side wall of the chamber body 12. The baffle plate 48 is configured by forming a film having corrosion resistance (a film of yttrium oxide or the like) on the surface of a base material formed of aluminum, for example. A plurality of through-holes are formed in the baffle plate 48. An exhaust port 12e is provided below the baffle plate 48 and at the bottom portion of the chamber body 12. An exhaust device 50 is connected to the exhaust port 12e through an exhaust pipe 52. The exhaust device 50 includes a pressure control valve and a vacuum pump such as a turbo molecular pump.

The plasma processing apparatus 1 includes a first radio frequency power source 62 and a second radio frequency power source 64. The first radio frequency power source 62 is a power source for generating first radio frequency power. The first radio frequency power has a frequency suitable for the generation of plasma. The frequency of the first radio frequency power is a frequency within the range from 27 MHz to 100 MHz, for example. The first radio frequency power source 62 is connected to the lower electrode 18 through a matcher 66 and the electrode plate 16. The matcher 66 has a circuit for matching the impedance on the load side (the lower electrode 18 side) of the first radio frequency power source 62 with the output impedance of the first radio frequency power source 62. The first radio frequency power source 62 may be connected to the upper electrode 30 through the matcher 66. The first radio frequency power source 62 configures a plasma generation unit of an example.

The second radio frequency power source 64 is a power source for generating second radio frequency power. The second radio frequency power has a frequency lower than the frequency of the first radio frequency power. In a case where the second radio frequency power is used together with the first radio frequency power, the second radio frequency power is used as radio frequency power for bias for attracting ions to the substrate W The frequency of the second radio frequency power is a frequency within the range from 400 kHz to 13.56 MHz, for example. The second radio frequency power source 64 is connected to the lower electrode 18 through a matcher 68 and the electrode plate 16. The matcher 68 has a circuit for matching the impedance on the load side (the lower electrode 18 side) of the second radio frequency power source 64 with the output impedance of the second radio frequency power source 64.

Plasma may be generated by using the second radio frequency power, that is, by using only a single radio frequency power, without using the first radio frequency power. In this case, the frequency of the second radio frequency power may be a frequency higher than 13.56 MHz, and be, for example 40 MHz. The plasma processing apparatus 1 may not include the first radio frequency power source 62 and the matcher 66. The second radio frequency power source 64 configures a plasma generation unit of an example.

In a case where plasma processing is performed in the plasma processing apparatus 1, a gas is supplied from the gas supply unit to the internal space 10s. Further, the first radio frequency power and/or the second radio frequency power is supplied, whereby a radio frequency electric field is generated between the upper electrode 30 and the lower electrode 18. The generated radio frequency electric field generates plasma from the gas in the internal space 10s.

The plasma processing apparatus 1 may further include a controller 80. The controller 80 may be a computer that includes a processor, a storage unit such as a memory, an input device, a display device, a signal input/output interface, and the like. The controller 80 controls each part of the plasma processing apparatus 1 in the controller 80, an operator can perform a command input operation and the like by using the input device in order to manage the plasma processing apparatus 1. Further, in the controller 80, the operating status of the plasma processing apparatus 1 can be visualized and displayed by the display device. Further, a control program and recipe data are stored in the storage unit. The control program is executed by the processor in order to execute various processing in the plasma processing apparatus 1. The processor executes the control program and controls each part of the plasma processing apparatus 1 according to the recipe data.

With reference to FIG. 1 again, the method MT will be described by taking as an example a case where the method MT is applied to the substrate W shown in FIG. 2 by using the plasma processing apparatus 1. In a case where the plasma processing apparatus 1 is used, the method MT can be executed in the plasma processing apparatus 1 by the control of each part of the plasma processing apparatus 1 by the controller 80. In the following description, the control of each part of the plasma processing apparatus 1 by the controller 80 for the execution of the method MT will also be described.

In an embodiment, the method MT may further include step STa. Step STa is executed before the alternate repetition of steps ST1 and ST2. In step STa, the substrate W shown in FIG. 2 is prepared. The substrate W is accommodated in the chamber 10 of the plasma processing apparatus 1 and placed on the electrostatic chuck 20 of the substrate support 14.

Figure 4:
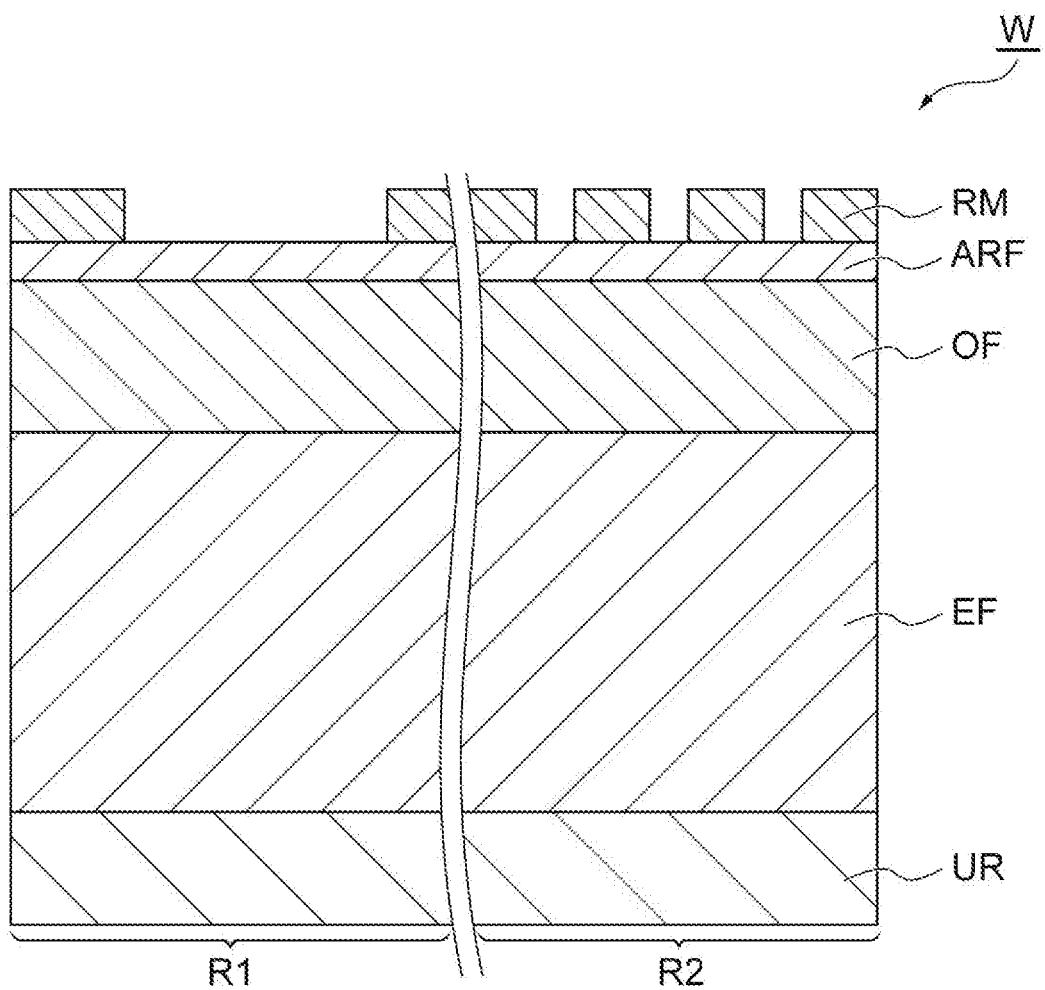
FIG. 4 is a partially enlarged sectional view of a substrate of an example in a state before a mask is formed.

Step STa may include processing of forming the mask MK shown in FIG. 2. FIG. 4 is a partially enlarged sectional view of a substrate of an example in a state before the mask is formed. As shown in FIG. 4, in an example, the substrate W further has an organic film OF, an antireflection film ARF, and a resist mask RM in a state before the formation of the mask MK.

The organic film OF is provided on the film EF. The organic film OF is a film from which the mask MK is formed, and is formed of an organic material. The antireflection film ARF is provided on the organic film OF. The antireflection film ARF may be an antireflection film containing silicon. A silicon oxide film may be provided between the organic film OF and the antireflection film ARF. The resist mask RM is provided on the antireflection film ARF. A pattern to be transferred to the organic film OF is formed in the resist mask RM. The pattern of the resist mask RM can be formed by a photolithography technique.

Before the mask MK is formed, the antireflection film ARF is patterned such that the pattern of the resist mask RM is transferred to the antireflection film ARE. The pattern of the resist mask RM is transferred to the antireflection film ARF by plasma etching. The antireflection film ARF is etched using, for example, plasma formed from a processing gas that includes a fluorocarbon gas.

The plasma processing apparatus 1 may be used for the plasma etching of the antireflection film ARF. In a case where the plasma processing apparatus 1 is used, the controller 80 controls the gas supply unit to supply the processing gas into the chamber 10, in a state where the substrate W shown in FIG. 4 is placed on the electrostatic chuck 20. Further, the controller 80 controls the exhaust device 50 to set the pressure in the chamber 10 to a specified pressure. The controller 80 controls the first radio frequency power source 62 and/or the second radio frequency power source 64 to supply the first radio frequency power and/or the second radio frequency power.

Next, the organic film OF is patterned such that the pattern of the antireflection film ARF is transferred to the organic film OF. The pattern of the antireflection film ARF is transferred to the organic film. OF by plasma etching. The organic film OF is etched using the plasma formed from a processing gas. The processing gas for the etching of the organic film OF is, for example, a mixed gas containing a nitrogen gas ($N_2$ gas) and a hydrogen gas ($H_2$ gas), or an oxygen-containing gas. The oxygen-containing gas is, for example, an oxygen gas ($O_2$ gas).

The plasma processing apparatus 1 may be used for the plasma etching of the organic film OF. In a case where the plasma processing apparatus 1 is used, the controller 80 controls the gas supply unit to supply the processing gas into the chamber 10, in a state where the substrate W after the patterning of the antireflection film ARF is placed on the electrostatic chuck 20. Further, the controller 80 controls the exhaust device 50 to set the pressure in the chamber 10 to a specified pressure. The controller 80 controls the first radio frequency power source 62 and/or the second radio frequency power source 64 to supply the first radio frequency power and/or the second radio frequency power.

As a result of the patterning of the organic film OF, the mask MK is formed from the organic film OF. After the patterning of the organic film OF, the antireflection film ARF may be left on the organic film OF. Therefore, the mask MK may be composed of the patterned organic film OF and the antireflection film ARF. The antireflection film ARF may disappear during the execution of steps ST1 and ST2.

Step ST1 and step ST2 are alternately repeated to etch the film EF. In step ST1, the first plasma etching is executed on the film EF by using the plasma of the first processing gas. The first processing gas includes a fluorocarbon gas. In an embodiment, in the fluorocarbon gas in the first processing gas, the ratio of (the number of carbon atoms)/(the number of fluorine atoms) may be ½ or more and ⅝ or less. In an embodiment, the fluorocarbon gas in the first processing gas may be a $C_4F_6$ gas, a $C_4F_8$ gas, or a $C_5F8$ gas.

The first processing gas further includes an additive gas. The additive gas is a source for nitrogen or sulfur and fluorine. The flow rate of the additive gas in the first processing gas is smaller than the flow rate of the fluorocarbon gas in the first processing gas. In an embodiment, the additive gas may be an $NF_3$ gas, an $SF_6$ gas, or a mixed gas containing a nitrogen gas ($N_2$ gas) and a fluorine gas ($F_2$ gas).

In an embodiment, the first processing gas may further include one or more other gases. The one or more other gases may include one or more gases among an oxygen-containing gas, a carbon-containing gas, and a noble gas. The oxygen-containing gas is, for example, an oxygen gas ($O_2$ gas). The carbon-containing gas is, for example, a carbon monoxide gas or a carbon dioxide gas. The noble gas is, for example, an Ar gas.

In step ST1, first plasma is formed from the first processing gas. In step ST1, in order to attract the ions from the first plasma to the substrate W to etch the film EF, radio frequency power for bias is supplied to the lower electrode of the substrate support that supports the substrate W.

In a case where the plasma processing apparatus 1 is used, for the execution of step ST1, the controller 80 executes first control. In the first control, the controller 80 controls the gas supply unit to supply the first processing gas into the chamber 10. In the first control, the controller 80 controls the gas supply unit to set the flow rate of the additive gas to a flow rate smaller than the flow rate of the fluorocarbon gas. In the first control, the controller 80 controls the exhaust device 50 to set the pressure in the chamber 10 to a specified pressure. In the first control, the controller 80 controls the first radio frequency power source 62 to supply the first radio frequency power in order to generate the first plasma from the first processing gas. Further, in the first control, the controller 80 controls the second radio frequency power source 64 to supply the second radio frequency power in order to attract ions from the first plasma to the substrate W to etch the film EF.

In step ST2, the second plasma etching is executed on the film EF by using the plasma of the second processing gas. The second processing gas includes a fluorocarbon gas. In an embodiment, in the fluorocarbon gas in the second processing gas, the ratio of (the number of carbon atoms)/(the number of fluorine atoms) may be ½ or more and ⅝ or less. In an embodiment, the fluorocarbon gas in the second processing gas may be a $C_4F_6$ gas, a $C_4F_8$ gas, or a $C_5F_8$ gas. The fluorocarbon gas that is included in the second processing gas may be the same as or different from the fluorocarbon gas that is included in the first processing gas. Unlike the first processing gas, the second processing gas does not include the additive gas described above.

In an embodiment, the second processing gas may further include one or more other gases. The one or more other gases may include one or more gases among an oxygen-containing gas, a carbon-containing gas, and a noble gas. The oxygen-containing gas is, for example, an oxygen gas ($O_2$ gas), The carbon-containing gas is, for example, a carbon monoxide gas or a carbon dioxide gas. The noble gas is, for example, an Ar gas.

In step ST2, the second plasma is formed from the second processing gas. In step ST2, in order to attract the ions from the second plasma to the substrate W to etch the film EF, radio frequency power for bias is supplied to the lower electrode of the substrate support that supports the substrate W.

In a case where the plasma processing apparatus 1 is used, for the execution of step ST2, the controller 80 executes second control. In the second control, the controller 80 controls the gas supply unit to supply the second processing gas into the chamber 10. In the second control, the controller 80 controls the exhaust device 50 to set the pressure in the chamber 10 to a specified pressure. In the second control, the controller 80 controls the first radio frequency power source 62 to supply the first radio frequency power in order to generate the second plasma from the second processing gas. Further, in the second control, the controller 80 controls the second radio frequency power source 64 to supply the second radio frequency power in order to attract ions from the second plasma to the substrate W to etch the film EF.

The method MT further includes step ST3, In step ST3, whether or not a stop condition is satisfied is determined. In an example, the stop condition is satisfied in a case where the number of times of alternate repetitions of steps ST1 and ST2 reaches a predetermined number of times. In step ST3, if it is determined that the stop condition is not satisfied, the sequence which includes step ST1 and step ST2 is executed again. In step ST3, if it is determined that the stop condition is satisfied, the method MT ends.

Figure 5:
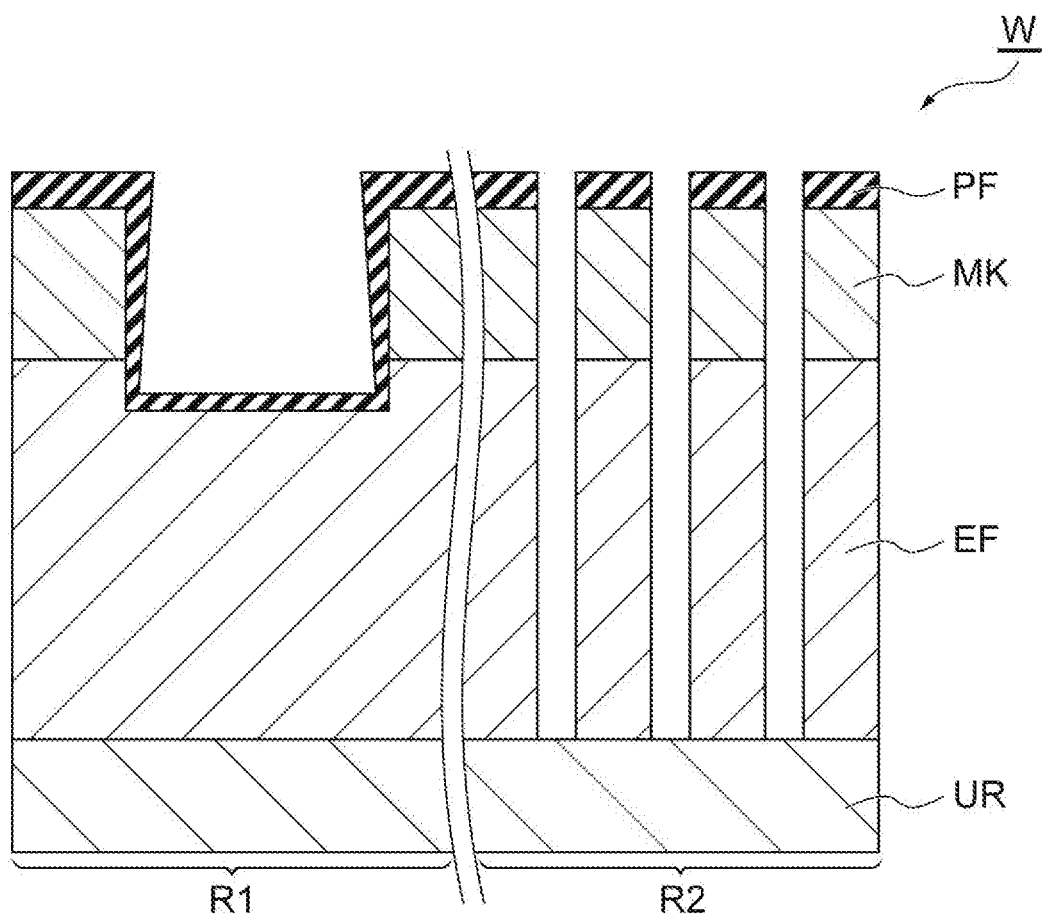
FIG. 5 is a partially enlarged sectional view of the substrate of an example, to which etching using plasma of a processing gas which includes a fluorocarbon gas and does not include an additive gas has been applied.

FIG. 5 is a partially enlarged sectional view of the substrate to of an example, to which etching using plasma of a processing gas that includes a fluorocarbon gas and does not include an additive gas has been applied. In a case where the processing gas that is used for the etching of the film EF does not include the above-described additive gas in the first processing gas, if the radio frequency power for bias is supplied to the lower electrode 18, the fluorine chemical species from the plasma of the fluorocarbon gas etches the film EF, However, in the first region R1, since a protective film PF formed of the carbon-containing substance from the plasma of the fluorocarbon gas is deposited to cover the surface of the substrate W, the etching of the film EF can be stopped as shown in FIG. 5.

Figure 6:
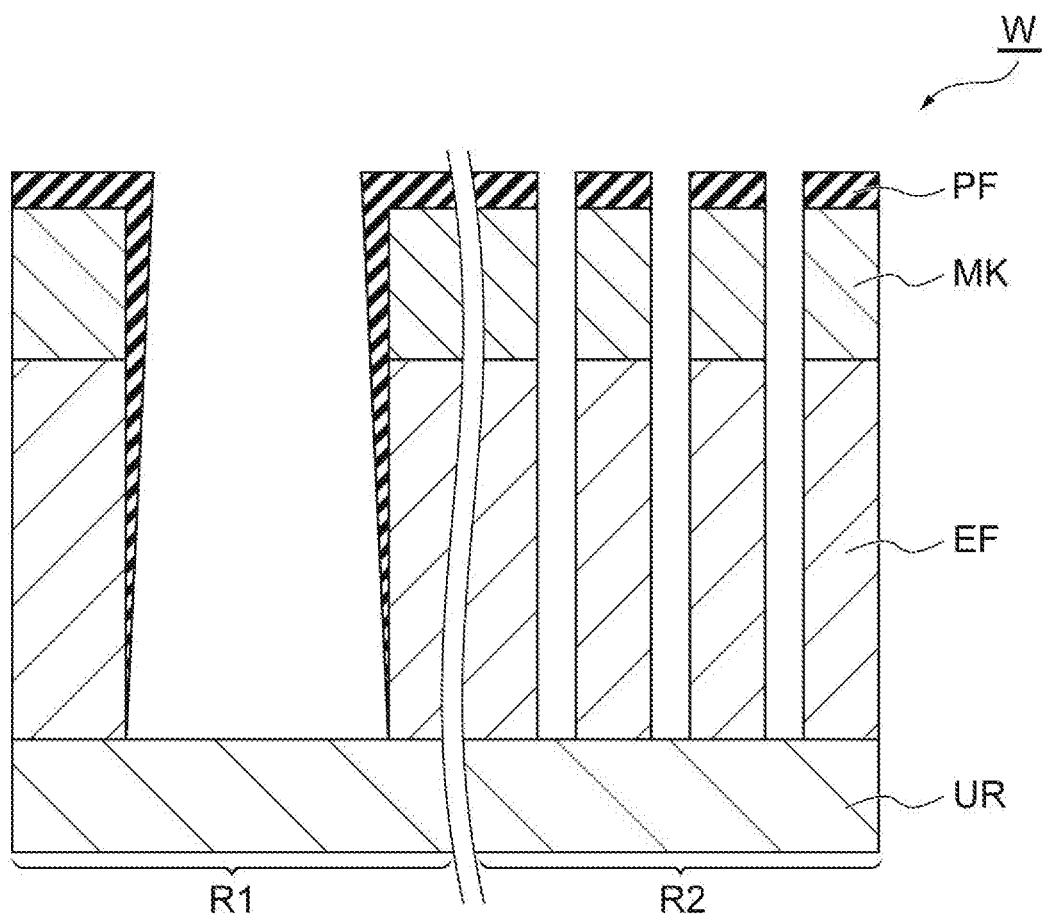
FIG. 6 is a partially enlarged sectional view of the substrate of an example, to which the method shown in FIG. 1 has been applied.

FIG. 6 is a partially enlarged sectional view of the substrate of an example, to which the method shown in FIG. 1 has been applied. On the other hand, in the method MT, since the additive gas is added to the first processing gas, a decrease in the etching rate of the film EF is prevented, and as shown in FIG. 6, the stop of the etching of the film EF in the first region R1 is prevented. Further, since the additive gas is added to the first processing gas out of the first processing gas and the second processing gas and the flow rate of the additive gas is smaller than the flow rate of the fluorocarbon gas in the first processing gas, the etching of the mask MK by the plasma of the additive gas can be prevented. Therefore, the selectivity of the etching of the film EF with respect to the mask MK is enhanced.

In an embodiment, step ST1 may be executed before step ST2. That is, in the alternate repetition of steps ST1 and ST2 in the method. MT, step ST1 may be first executed.

In an embodiment, the processing time length of step ST1 may be longer than the processing time length of step ST2. According to such an embodiment, the film EF is etched in a shorter time.

In an embodiment, the flow rate of fluorocarbon gas in the second processing gas may be larger than the flow rate of fluorocarbon gas in the first processing gas. According to such an embodiment, in step ST2, the thickness of the protective film formed of the carbon-containing substance on the mask MK can be increased. Therefore, the selectivity of the etching of the film EF with respect to the mask MK is further enhanced.

In an embodiment, the method MT may be executed in a device manufacturing method. The device manufacturing method includes etching the film ET by executing the method MT. The device which is made by this device manufacturing method may be a MOS device such as a CMOS image sensor.

While various exemplary embodiments have been described above, various additions, omissions, substitutions and changes may be made without being limited to the exemplary embodiments described above. Elements of the different embodiments may be combined to form another embodiment.

For example, the plasma processing apparatus which is used for the execution of the method MT may be a capacitively-coupled plasma processing apparatus different from the plasma processing apparatus 1, The plasma processing apparatus which is used for the execution of the method MT may be another type of plasma processing apparatus such as an inductively-coupled plasma processing apparatus or a plasma processing apparatus that generates plasma by using surface waves such as microwaves.

Hereinafter, various experiments performed for evaluation of the method MT will be described. The present disclosure is not limited by the experiments described below.

In first to fourth experiments, the same sample substrate as the substrate W shown in FIG. 2 was prepared. The film EF of the sample substrate was a silicon oxide film. The mask MK of the sample substrate was a mask formed of an organic material. The width of the opening (trench) which is provided by the mask MK in the second region R2 of the sample substrate was about 400 nm. The width of the opening (trench) which is provided by the mask MK in the first region R1 of the sample substrate was about 10 times the width of the opening which is provided by the mask MK in the second region R2. In each of the first to fourth experiments, the etching of the film EF of the sample substrate was performed using the plasma processing apparatus 1. In the first experiment and the second experiment, the etching of the film EF of the sample substrate was performed by executing the method MT. In the first experiment, the processing time length of step ST1 was three times the processing time length of step ST2. In the second experiment, the processing time length of step ST1 and the processing time length of step ST2 were equal to each other. In the third experiment, the film EF was etched by plasma of a processing gas which includes a fluorocarbon gas and does not include the additive gas described above. In the fourth experiment, the film EF was etched by plasma of a processing gas which includes a fluorocarbon gas and the additive gas described above. The conditions of the first to fourth experiments are shown below.

<Conditions of First Experiment>
First processing gas: mixed gas of 68 sccm of a $C_4F_6$ gas, 6 sccm of an $NF_3$ gas, 836 sccm of an Ar gas, 60 scan of an $O_2$ gas, and 200 sccm of a CO gas
Second processing gas: mixed gas of 68 sccm of a $C_4F_6$ gas, 836 sccm of an Ar gas, 60 sccm of an $O_2$ gas, and 200 sccm of a CO gas
Processing time of step ST1: 30 seconds
Processing time of step ST2: 10 seconds
Number of times of alternate repetitions of steps ST1 and ST2: 15 times
Pressure in chamber 10 in steps ST1 and ST2: 25 mTorr (3.333 Pa)
First radio frequency power in steps ST1 and ST2: 40 MHz, 2700 W
Second radio frequency power in steps ST1 and ST2: 3.2 MHz, 5000 W <Conditions of Second Experiment>
First processing gas: mixed gas of 68 sccm of a $C_4F_6$ gas, 6 sccm of an $NF_3$ gas, 836 sccm of an Ar gas, 60 sccm of an $O_2$ gas, and 200 sccm of a CO gas
Second processing gas: mixed gas of 68 sccm of a $C_4F_6$ gas, 836 sccm of an Ar gas, 60 sccm of an $O_2$ gas, and 200 sccm of a CO gas
Processing time of step ST1: 20 seconds
Processing time of step ST2: 20 seconds
Number of times of alternate repetitions of steps ST1 and ST2: 15 times
Pressure in chamber 10 in steps ST1 and ST2: 25 mTorr (3.333 Pa)
First radio frequency power in steps ST1 and ST2: 40 MHz, 2700 W
Second radio frequency power in steps ST1 and ST2: 3.2 MHz, 5000 W <Conditions of Third Experiment>
Processing gas: a mixed gas of 68 sccm of a $C_4F_6$; gas, 800 sccm of an Ar gas, 60 sccm of an $O_2$ gas, and 200 sccm of a CO gas
Processing time: 600 seconds
Pressure in chamber 10: 25 mTorr (3.333 Pa)
First radio frequency power: 40 MHz, 2700 W
Second radio frequency power: 3.2 MHz, 5000 W <Conditions of Fourth Experiment>
Processing gas: a mixed gas of 68 sccm of a $C_4F_6$ gas, 6 sccm of an $NF_3$ gas, 800 sccm of an Ar gas, 60 sccm of an $O_2$ gas, and 200 sccm of a CO gas
Processing time: 600 seconds
Pressure in chamber 10: 25 mTorr (3.333 Pa)
First radio frequency power: 40 MHz, 2700 W
Second radio frequency power: 3.2 MHz, 5000 W In each of the first to fourth experiments, the etching rate of the film EF in the second region R2, the presence or absence of the stop of the etching of the film EF in the first region R1, and the selection ratio of the etching of the film EF with respect to the mask MK were obtained. The selection ratio was obtained as a value obtained by dividing the etching rate of the film EF by the etching rate of the mask MK. In the third experiment, the etching rate of the film EF in the second region R2 was 454 nm/min, and the selection ratio was 21.8. However, in the third experiment, the stop of the etching of the film EF in the first region R1 occurred. In the fourth experiment in which an NF3 gas as the additive gas was added to the processing gas, the stop of etching in the first region R1 did not occur. Further, in the fourth experiment, the etching rate of the film EF in the second region R2 was 452 nm/min, and an etching rate equivalent to that in the third experiment was obtained. However, in the fourth experiment, the selection ratio was 1.0.4, which was considerably smaller than the selection ratio in the third experiment.

In the first experiment, the etching rate of the film EF in the second region R2 was 456 nm/min, the stop of the etching of the film EF in the first region R1 did not occur, and the selection ratio was 19.2, Further, in the second experiment, the etching rate of the film EF in the second region R2 was 462 nm/min, the stop of the etching of the film EF in the first region R1 did not occur, and the selection ratio was 21.8. The etching rate of the first region R1 in the first experiment was higher than the etching rate of the first region R1 in the second experiment. Therefore, in the first experiment and the second experiment based on the method MT, it was confirmed that a decrease in the etching rate of the film EF is prevented, the stop of the etching of the film EF in the first region R1 is prevented, and the selectivity of the etching of the film EF with respect to the mask MK was enhanced. Further, it is confirmed that by setting the processing time length of step ST1 to a time length longer than the processing time length of step ST2, it is possible to perform the etching of the film EF in the first region R1 in a short time.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A method of etching a film of a substrate, the substrate having the film capable of being etched by fluorine chemical species, and a mask provided on the film, and the mask providing, in a first region in the substrate, an opening having a width larger than a width of an opening provided in a second region in the substrate, the method comprising:
    (a) etching the film by using plasma of a first processing gas including a fluorocarbon gas; and

(b) etching the film by using plasma of a second processing gas including a fluorocarbon gas,
wherein said (a) and said (b) are alternately repeated,
in both of said (a) and said (b), radio frequency power is supplied to a lower electrode of a substrate support supporting the substrate to attract ions to the substrate to etch the film,
the first processing gas further includes an additive gas that is a source for nitrogen or sulfur and fluorine, and
a flow rate of the additive gas in the first processing gas is smaller than a flow rate of the fluorocarbon gas in the first processing gas.

2. The method according to claim 1, wherein the additive gas is an $NF_3$ gas, an $SF_6$ gas, or a mixed gas containing a nitrogen gas and a fluorine gas.

3. The method according to claim 1, wherein in each of the fluorocarbon gas included in the first processing gas and the fluorocarbon gas included in the second processing gas, a ratio of (number of carbon atoms)/(number of fluorine atoms) is ½ or more and ⅝ or less.

4. The method according to claim 1, wherein each of the fluorocarbon gas included in the first processing gas and the fluorocarbon gas included in the second processing gas is a $C_4F_6$ gas, a $C_4F_8$ gas, or a $C_5F8$ gas.

5. The method according to claim 1, wherein a time length of said (a) is longer than a time length of said (b).

6. The method of claim 1, wherein said (a) is executed before said (b).

7. The method of claim 1, wherein the film is a silicon-containing film.

8. The method according to claim 7, wherein the silicon-containing film is a silicon film or a silicon oxide film.

9. The method of claim 1, wherein a flow rate of the fluorocarbon gas in the second processing gas is larger than the flow rate of the fluorocarbon gas in the first processing gas.

10. A device manufacturing method comprising:
etching a film of a substrate by the method according to claim 1.

* * * * *